US009864023B2

(12) United States Patent
Höcht

(10) Patent No.: US 9,864,023 B2
(45) Date of Patent: Jan. 9, 2018

(54) COMBINED SHIM AND RF COIL ARRANGEMENT

(71) Applicant: Philipp Höcht, Rückersdorf (DE)

(72) Inventor: Philipp Höcht, Rückersdorf (DE)

(73) Assignee: Siemens Aktiengesellschaft, München (DE)

(*) Notice: Subject to any disclaimer, the term of this patent is extended or adjusted under 35 U.S.C. 154(b) by 625 days.

(21) Appl. No.: 14/476,449

(22) Filed: Sep. 3, 2014

(65) Prior Publication Data
US 2015/0061676 A1 Mar. 5, 2015

(30) Foreign Application Priority Data
Sep. 3, 2013 (DE) .................. 10 2013 217 555

(51) Int. Cl.
G01V 3/00 (2006.01)
G01R 33/34 (2006.01)
G01R 33/341 (2006.01)
G01R 33/3875 (2006.01)
G01R 33/36 (2006.01)

(52) U.S. Cl.
CPC .......... G01R 33/34 (2013.01); G01R 33/341 (2013.01); G01R 33/3607 (2013.01); G01R 33/3875 (2013.01); G01R 33/34007 (2013.01)

(58) Field of Classification Search
CPC .. A61B 5/055; G01R 33/4828; G01R 33/543; G01R 33/50; G01R 33/5608
USPC ...................................................... 324/318
See application file for complete search history.

(56) References Cited

U.S. PATENT DOCUMENTS

| 4,820,987 A | * | 4/1989 | Mens | G01R 33/34046 324/318 |
| 5,045,792 A | | 9/1991 | Mehdizadeh | |
| 5,317,266 A | | 5/1994 | Meissner | |
| 6,958,608 B2 | * | 10/2005 | Takagi | G01R 33/3456 324/309 |
| 7,138,801 B2 | * | 11/2006 | Yamamoto | G01R 33/34053 324/318 |
| 7,397,246 B2 | * | 7/2008 | Freytag | G01R 33/34069 324/318 |
| 7,830,146 B2 | * | 11/2010 | Tanaka | G01R 33/34046 324/318 |
| 2004/0189302 A1 | | 9/2004 | Yoshida | |

(Continued)

FOREIGN PATENT DOCUMENTS

CN 1531903 A 9/2004
CN 1534305 A 10/2004
(Continued)

OTHER PUBLICATIONS

Chinese Office Action for related Chinese Application No. 2014 104 459 81.0 dated Nov. 15, 2016, with English Translation.
(Continued)

Primary Examiner — Walter L Lindsay, Jr.
Assistant Examiner — Frederick Wenderoth
(74) Attorney, Agent, or Firm — Lempia Summerfield Katz LLC

(57) ABSTRACT

A coil arrangement for a magnetic resonance tomography device includes at least two antennas connected in parallel to one another for RF signals and connected in series with one another for direct current signals.

18 Claims, 3 Drawing Sheets

(56) References Cited

U.S. PATENT DOCUMENTS

| | | | | |
|---|---|---|---|---|
| 2005/0127914 A1* | 6/2005 | Eberler | .............. | G01R 33/3657 |
| | | | | 324/318 |
| 2009/0028497 A1* | 1/2009 | Kodama | ................. | G02B 6/43 |
| | | | | 385/14 |
| 2009/0302847 A1* | 12/2009 | Knizhnik | ................ | G01V 3/18 |
| | | | | 324/332 |
| 2010/0203922 A1* | 8/2010 | Knecht | ................... | H04B 1/44 |
| | | | | 455/561 |
| 2010/0244977 A1* | 9/2010 | Feng | ........................ | H01P 5/10 |
| | | | | 333/26 |
| 2011/0260727 A1* | 10/2011 | Punchard | ........... | G01R 33/3875 |
| | | | | 324/318 |
| 2014/0002084 A1* | 1/2014 | Han | ................... | G01R 33/3628 |
| | | | | 324/322 |

FOREIGN PATENT DOCUMENTS

| | | |
|---|---|---|
| DE | 10314215 B4 | 11/2006 |
| DE | 102013217555 B3 | 12/2014 |
| JP | S63179506 A | 7/1988 |
| WO | WO2013011406 A2 | 1/2013 |
| WO | WO2014003918 A1 | 1/2014 |

OTHER PUBLICATIONS

German Office Action for German Application No. 10 2013 217 555.8, dated Mar. 17, 2014, with English Translation.
http://www.ats.net/de/index.php/Technologie/Kernthemen/Embedded+Component+Packaging/c-13667-Embedded+Chip+Technology.html, Apr. 14, 2013.
German Notice of Allowance for related German Application No. 10 2013 217 555.8 dated Aug. 1, 2014, with English Translation.

* cited by examiner

COMBINED SHIM AND RF COIL ARRANGEMENT

This application claims the benefit of DE 10 2013 217 555.8, filed on Sep. 3, 2013, which is hereby incorporated by reference in its entirety.

BACKGROUND

The present embodiments relate to a coil arrangement for a magnetic resonance tomography device.

Magnetic resonance devices (MRTs) for examining objects or patients using magnetic resonance tomography are known, for example, from DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, a coil arrangement for a magnetic resonance tomography device is optimized.

DETAILED DESCRIPTION

Figure 3:
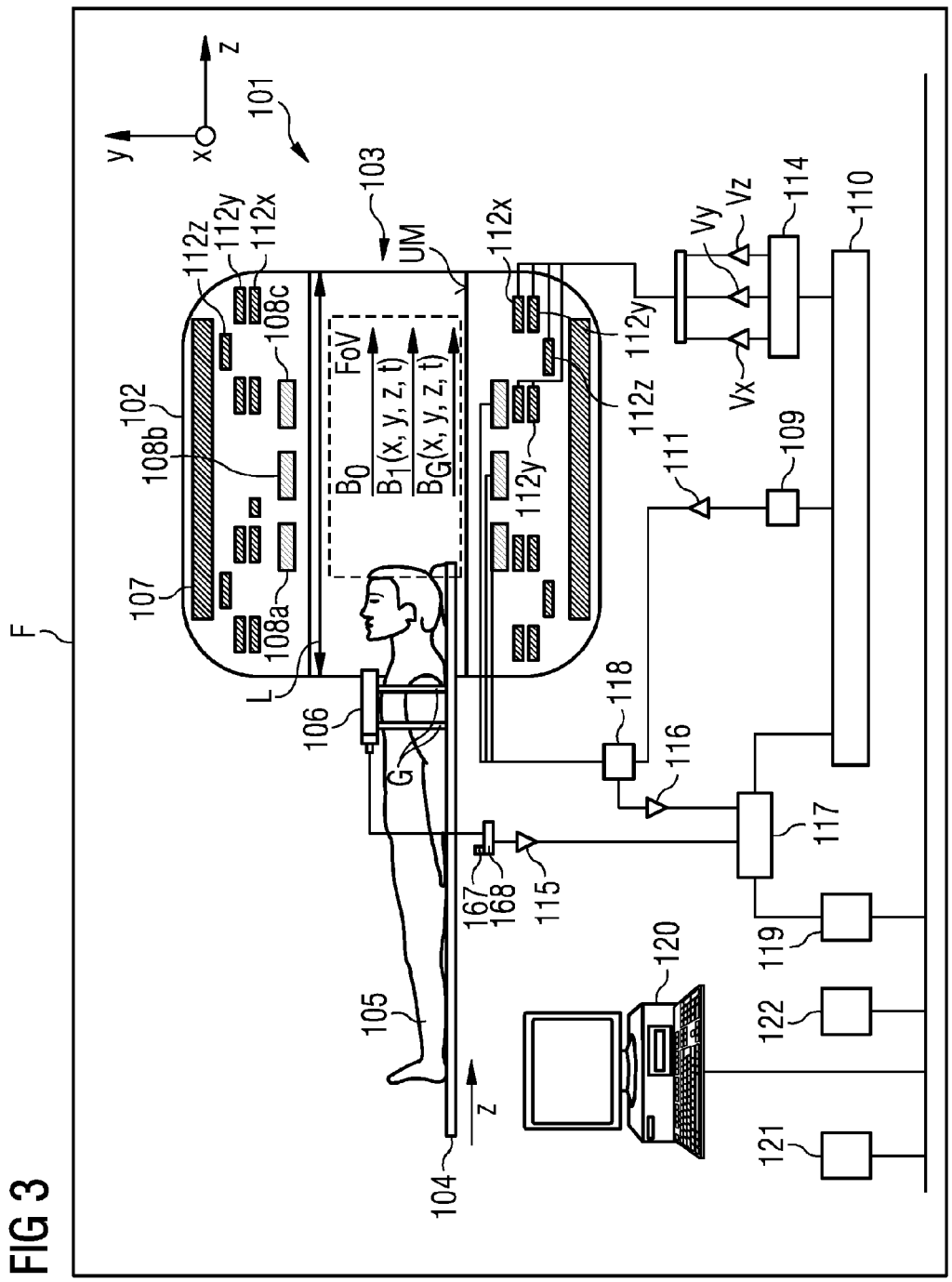
FIG. 3 schematically shows one embodiment of a magnetic resonance tomography (MRT) system.

FIG. 3 shows one embodiment of a magnetic resonance imaging device MRT 101 (e.g., located in a shielded room or Faraday cage F) including a hollow cylinder 102 (e.g., resulting from the shape of the magnet including cladding) having, for example, a tubular space 103 into which a patient couch 104 bearing a body 105 (e.g., of an examination object such as a patient; with or without local coil arrangement 106) may be introduced in the direction of the arrow z so that images of the patient 105 may be generated by an imaging method. Disposed on the patient, for example, is a local coil arrangement 106 that may be used in a local region (e.g., field of view (FOV)) of the MRT to generate images of a subregion of the body 105 in the FOV. Signals from the local coil arrangement 106 may be evaluated (e.g., converted to images, stored or displayed) by an evaluation facility (e.g., elements 168, 115, 117, 119, 120, 121, etc.) of the MRT 101 that may be connected, for example, via coaxial cable or radio (e.g., element 167) to the local coil arrangement 106.

When the magnetic resonance device MRT 101 is used in order to examine a body 105 (e.g., an examination object or a patient) using magnetic resonance imaging, different magnetic fields that are coordinated with one another with the utmost precision in terms of temporal and spatial characteristics are radiated onto the body 105. A strong magnet (e.g., a cryomagnet 107) in a measurement chamber having, for example, a tunnel-shaped opening 103 generates a strong static main magnetic field $B_0$ ranging, for example, from 0.2 Tesla to 3 Tesla or more. A body 105 that is to be examined, supported on a patient couch 104, is moved into a region of the main magnetic field B0 that is approximately homogeneous in the area of observation FOV. The nuclear spins of atomic nuclei of the body 105 are excited via magnetic radio-frequency excitation pulses B1(x, y, z, t) that are emitted via a radio-frequency antenna (e.g., and/or a local coil arrangement if necessary) depicted in FIG. 3 in greatly simplified form as a body coil 108 (e.g., a multipart body coil 108a, 108b, 108c). Radio-frequency excitation pulses are generated, for example, by a pulse generation unit 109 that is controlled by a pulse sequence control unit 110. Following amplification by a radio-frequency amplifier 111, the pulses are directed to the radio-frequency antenna 108. The radio-frequency system shown in FIG. 3 is indicated only schematically. In other embodiments, more than one pulse generation unit 109, more than one radio-frequency amplifier 111 and a plurality of radio-frequency antennas 108a, b, c may be used in a magnetic resonance device 101.

The magnetic resonance device 101 also includes gradient coils 112x, 112y, 112z by which magnetic gradient fields $B_G$(x, y, z, t) are radiated in the course of a measurement in order to provoke selective layer excitation and for spatial encoding of the measurement signal. The gradient coils 112x, 112y, 112z are controlled by a gradient coil control unit 114 (e.g., and via amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106, amplified by assigned radio-frequency preamplifiers 116 and further processed and digitized by a receive unit 117. The recorded measurement data is digitized and stored in the form of complex numeric values in a k-space matrix. A multidimensional Fourier transform may be used to reconstruct an associated MR image from the value-populated k-space matrix.

For a coil, which may be operated in both transmit and receive mode (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

In MR tomography, images having a high signal-to-noise ratio (SNR) may be acquired by local coil arrangements (e.g., coils, local coils). These are antenna systems that are mounted in immediate proximity to (e.g., on (anterior), under (posterior), on or in) the body 105. In the course of an MR measurement, the excited nuclei induce a voltage in the individual antennas of the local coil. The induced voltage is amplified by a low-noise preamplifier (e.g., LNA, preamp) and forwarded to the receive electronics. High-field systems (e.g., 1.5T-12T or more) are used to improve the signal-to-noise ratio, even with high-resolution images. If more individual antennas may be connected to an MR receiving system than there are receivers present, for example, a switching array is installed between receive antennas and receivers. The array routes the currently active receive channels (e.g., the receive channels currently lying in the FoV of the magnet) to the receivers present. This enables more coil elements to be connected than there are receivers available, since in the case of whole-body coverage, only the coils that are located in the FoV or in the homogeneity volume of the magnet may be read out.

Local coil arrangement 106 may be, for example, an antenna system that may include one antenna element or a plurality of antenna elements (e.g., coil elements) configured as an array coil. These individual antenna elements are configured, for example, as loop antennas (e.g., loops), butterfly coils, flex coils or saddle coils. A local coil arrangement includes, for example, coil elements, a preamplifier, further electronic elements (e.g., baluns, etc.), a housing, bearings and may include a cable with plug that is used to connect the local coil arrangement to the MRT system. A receiver 168 mounted on the system side filters and digitizes a signal received, for example, wirelessly by a local coil 106 and passes the data to a digital signal processing device that, for example, derives an image or a spectrum from the data acquired by a measurement and makes the image or the spectrum available to the user, for example, for subsequent diagnosis by the user and/or for storage in a memory.

Figure 1:
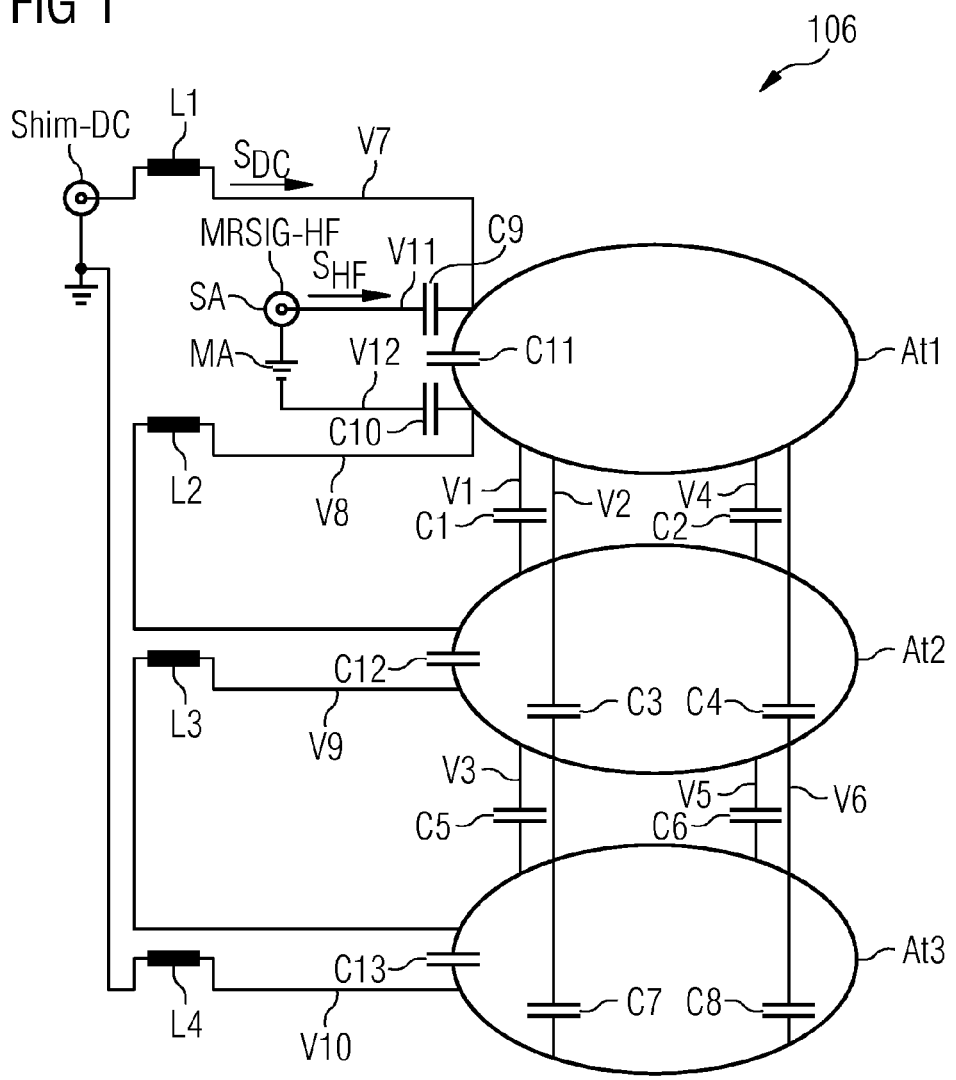
FIG. 1 shows, schematically and simplified as a circuit plan, an exemplary embodiment in the form of a coil arrangement.
Figure 2:
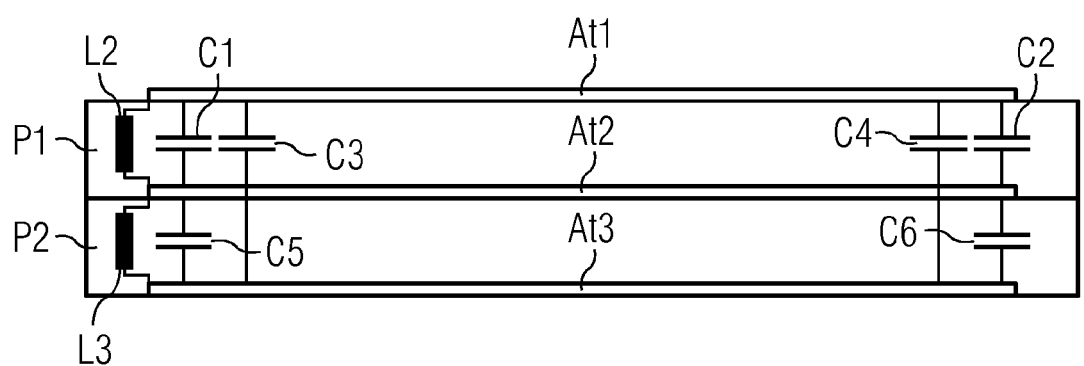
FIG. 2 shows, schematically and simplified in cross-section, an exemplary embodiment in the form of a multi-layer board with combined RF and shim coils.

FIG. 1 and FIG. 2 illustrate exemplary embodiments.

A homogeneous, static magnetic field B0 is used in magnetic resonance imaging and spectroscopy. Non-homogeneities in the B0 field reduce the quality of the data acquisition. An attempt is therefore made to compensate for the non-homogeneities in the B0 field as much as possible.

In known MR systems, two measures to compensate for B0 non-homogeneities are employed.

Passive Shimming

Using small metal plates that, in appropriate apparatuses, are attached to the magnet wall, B0 non-homogeneities in the magnet may be compensated for.

Active shimming

The patient may also generate B0 non-homogeneities. These may be compensated for by impressing a DC current into shim coils (e.g., for linear terms, the gradient coil, for higher orders dedicated, coils that are integrated into the gradient coil). In practice, for example, five coils are used to compensate for second-order terms. In research, higher-order systems (e.g., third order and higher) are already being trialed.

There are also known attempts to use the individual loops of an RF receive coil additionally as shim coils. However, the inductance of an individual RF loop is relatively low. This achieves either only a very small field rise, or high currents that may result in local warming, which would be undesirable for reasons of safety and patient comfort, are to be impressed.

According to one embodiment, the RF loop of an RF receive coil (e.g., a local coil or as a coil arrangement) using a plurality of loops (e.g., antennas or coils) connects in parallel from an RF perspective, but serially interconnects from a DC perspective.

The loops may be connected in parallel to capacitors acting for the RF as a short circuit. Using inductances that represent a high impedance for the RF, the loops may be connected in series for the direct voltage.

The multilayer structure has the following advantages, for example. The inductance, from a DC perspective, increases with the number of coils connected in series. The current required reduces to the same extent with the same field rise. Connecting a plurality of RF loops in parallel reduces the ohmic losses. The sensitivity of the receive antennas thereby increases.

The multilayer structure may, for example, be achieved using a multilayer board. Components may be integrated into the layer structure thus allowing a simple, reliable and low-inductance AC coupling between the RF loops (e.g., Embedded Component Packaging from AT&S, http://www.ats.net/de/index.php/Technologie/Kernthemen/Embedded+Component+Packaging/c-13667-Embedded+Chip+Technology.html).

FIG. 1 shows, in a schematic and simplified manner as a circuit plan, an exemplary embodiment of a coil arrangement (e.g., a local coil 106) for a magnetic resonance tomography device 101 that has antennas At1, At2, At3 (e.g., loops that may be only or also RF receive coils) that, for RF signals, are connected in parallel to one another. The antennas At1, At2, At3 are connected in series to one another for direct current signals $S_{DC}$. RF signals are (e.g., when using the antennas At1, At2, At3 for RF reception from antennas At1, At2, At3 in the direction of an outlet MRSIG-HF) transmitted in the opposite direction to the arrows in FIG. 1. If the antennas At1, At2, At3 are also used as transmit antennas, signals to be sent by antennas At1, At2, At3 from MRSIG-HF in the direction of the antennas At1, At2, At3 are transmitted in the direction of the arrows in FIG. 1.

The antennas At1, At2, At3 my all be serially connected to a shim signal source Shim-DC supplying a direct current signal $S_{DC}$ and/or to one another via one or more inductors L1, L2, L3, L4 (e.g., in electrically conducting connections V7, V8, V9, V10) in each case.

The antennas At1, At2, At3 may also all be connected (e.g., in parallel) to an outlet MRSIG-HF outputting an MRT radio-frequency signal $S_{HF}$ from the circuit shown and/or to one another via at least one capacitor C1, C2, C3, C4, C5, C6, C7, C8, C9, C10 (e.g., in electrically conducting connections V1, V2, V4, V4, V5, V6) in each case. For receipt of radio-frequency signals, the antennas At1, At2, At3 may be connected to an LNA/receiver etc. At the outlet MRSIG, a duplexer, via which the RF signals may be transmitted to the antennas At1, At2, At3 if the antennas At1, At2, At3 are also to transmit, may also be connected upstream.

The antennas At1, At2, At3 are connected to one another via capacitors C1, C2, C3, C4, C5, C6 and are connected via inductors L2, L3.

The antennas At1, At2, At3 are therefore connected in parallel to one another by the inductors L1, L2, L3, L4 and by capacitors C1, C2, C3, C4, C5, C6, C7, C8, C9, C10 for RF signals $S_{HF}$ and in series to one another for direct current signals $S_{DC}$.

For a direct current signal $S_{DC}$ from a shim signal source Shim-DC, inductors L2, L3 of the coil arrangement are in each case provided in a conducting manner (e.g., as a short circuit) between antennas At1, At2, At3, whereas for a direct current signal $S_{DC}$ from a shim signal source Shim-DC, capacitors C1, C2, C3, C4, C5, C6, C7, C8 of the coil arrangement are provided as a block between antennas At1, At2, At3.

For an MRT radio-frequency signal $S_{HF}$ from a radio-frequency signal source, MRSIG-HF inductors L2, L3 of the coil arrangement are provided as a block between antennas At1, At2, At3, whereas for an MRT radio-frequency signal $S_{HF}$, capacitors C1, C2, C3, C4, C5, C6, C7, C8 of the coil arrangement are provided in a conducting manner and/or as a short circuit between antennas At1, At2, At3.

FIG. 2 shows a schematic and simplified cross-section of an exemplary embodiment of one embodiment of a coil arrangement 106 (e.g., the coil arrangement in FIG. 1 and/or 3). The antennas At1, At2, At3 of the coil arrangement 106 are arranged inside and/or on a plurality of layers of boards P1, P2 lying one above the other (e.g., a multilayer board).

In this case, inductors L1, L2 etc. and/or capacitors C1, C2, C3, C4, C5, C6 etc. may be arranged in and/or between the boards P1, P2. For example, inductors (e.g., L2, L3 etc.) may also be configured on a multilayer board (e.g., including a plurality of boards P1, P2) as, for example, a surface mounted device (SMD) with through-plating (e.g., through one or more boards, to the antennas).

Via the antennas At1, At2, At3 of the coil arrangement 106, an MRT radio-frequency signal $S_{HF}$ may be transmitted on a multichannel basis, and an MRT radio-frequency signal (e.g., from the body of a patient) may be received on a multichannel basis.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A coil arrangement for a magnetic resonance tomography (MRT) device, the coil arrangement comprising:
   at least two antennas connected in parallel to one another for RF signals, and connected in series with one another for direct current signals.

2. The coil arrangement of claim 1, wherein each antenna of the at least two antennas is connected to a shim signal source supplying a direct current signal via at least one inductor.

3. The coil arrangement of claim 1, wherein the at least two antennas are connected to a radio-frequency signal source supplying an MRT radio-frequency signal via at least one capacitor in each case.

4. The coil arrangement of claim 1, wherein the at least two antennas are connected to one another via capacitors.

5. The coil arrangement of claim 1, wherein the at least two antennas are connected to one another via inductors.

6. The coil arrangement of claim 1, wherein the at least two antennas are connected in parallel to one another by inductors and capacitors for the RF signals and are connected in series to one another for the direct current signals.

7. The coil arrangement of claim 1, wherein for a direct current signal from a shim signal source, inductors of the coil arrangement are provided in a conducting manner, as a short circuit to, between, or to and between antennas, or a combination thereof, and
   wherein for a direct current signal from the shim signal source, capacitors of the coil arrangement are provided as a block to, between, or to and between antennas.

8. The coil arrangement of claim 1, wherein for an MRT radio-frequency signal from a radio-frequency signal source, inductors of the coil arrangement are provided as a block to, between, or to and between antennas, and
   wherein for an MRT radio-frequency signal from a radio-frequency signal source, capacitors of the coil arrangement are provided in a conducting manner, as a short circuit to, between, or to and between antennas, or a combination thereof.

9. The coil arrangement of claim 1, wherein the at least two antennas are arranged in or on a plurality of layers of boards lying one above the other.

10. The coil arrangement of claim 1, wherein the at least two antennas are arranged in a plurality of layers above one another in or on boards of a multilayer board lying one above the other.

11. The coil arrangement of claim 1, wherein the at least two antennas are connected to one another in a plurality of layers in or on boards lying one above the other via inductors arranged in, between, or in and between the boards and via capacitors arranged in, between, or in and between the boards.

12. The coil arrangement of claim 10, wherein inductors, capacitors, or the inductors and the capacitors are arranged on an uppermost of the boards, under a lowermost of the boards, or on the uppermost of the boards and under the lowermost of the boards.

13. The coil arrangement of claim 12, wherein the inductors, the capacitors, or the inductors and the capacitors are arranged on a side of the uppermost of the boards or the lowermost of the boards facing away from other boards.

14. The coil arrangement of claim 2, wherein the inductors are configured on a multilayer board.

15. The coil arrangement of claim 14, wherein the inductors are configured on the multilayer board as a surface mounted device (SMD), with through-plating, or as the SMD and with through-plating.

16. The coil arrangement of claim 1, wherein the at least two antennas are configured to transmit an MRT radio-frequency signal on a multichannel basis.

17. The coil arrangement of claim 1, wherein the at least two antennas are configured to receive an MRT radio-frequency signal on a multichannel basis.

18. The coil arrangement of claim 1, wherein the coil arrangement is an MRT local coil.

* * * * *